United States Patent
Nakanishi

(10) Patent No.: US 9,904,164 B2
(45) Date of Patent: Feb. 27, 2018

(54) GLASS SUBSTRATE FOR MASK BLANK

(71) Applicant: Asahi Glass Company, Limited, Chiyoda-ku (JP)

(72) Inventor: Hiroshi Nakanishi, Tokyo (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 132 days.

(21) Appl. No.: 15/002,747

(22) Filed: Jan. 21, 2016

(65) Prior Publication Data

US 2016/0223898 A1    Aug. 4, 2016

(30) Foreign Application Priority Data

Feb. 3, 2015    (JP) .................. 2015-019255

(51) Int. Cl.
*G03F 1/24*    (2012.01)
*G03F 1/60*    (2012.01)

(52) U.S. Cl.
CPC .................... *G03F 1/60* (2013.01)

(58) Field of Classification Search
CPC ..... G03F 1/22; G03F 1/24; G03F 1/50; G03F 1/60
USPC ............................................. 430/5
See application file for complete search history.

(56) References Cited

U.S. PATENT DOCUMENTS

2008/0311487 A1* 12/2008 Ito .................. B24B 37/22
430/5

* cited by examiner

*Primary Examiner* — Stephen Rosasco
(74) *Attorney, Agent, or Firm* — Oblon, McClelland, Maier & Neustadt, L.L.P.

(57) ABSTRACT

A glass substrate for a mask blank has main surfaces. A root-mean-square surface roughness (RMS) in at least one main surface is 0.15 nm or less. An aspect ratio of a surface profile (Str) of the main surface in accordance with ISO 25178-2:2012, where s=0.2, is 0.30 or more. The aspect ratio is determined through measurement of the surface profile at measurement intervals of 0.2 nm or less in a measurement range of 100 nm×100 nm using an atomic force microscope.

14 Claims, 2 Drawing Sheets

GLASS SUBSTRATE FOR MASK BLANK

CROSS-REFERENCE TO RELATED APPLICATIONS

This application claims priority from Japanese Patent Application No. 2015-019255 filed on Feb. 3, 2015, the entire subject matter of which is incorporated herein by reference.

BACKGROUND OF THE INVENTION

Technical Field

An aspect of the present invention relates to a glass substrate for mask blanks for use in various kinds of lithography, and to its production method. An aspect of the present invention is favorable for a glass substrate for mask blanks to be used in lithography using EUV (extreme ultraviolet) light (hereinafter abbreviated as "EUVL") (hereinafter this is abbreviated as "glass substrate for EUVL mask blank").

An aspect of the present invention is also favorable for a glass substrate for mask blanks for use in lithography using an already-existing transmission optical system, for example, for a glass substrate for mask blanks for lithography using an ArF excimer laser or a KrF excimer laser.

Background Art

With the recent tendency toward high-density and high-precision ultra-LSI devices, the specifications required for the main surface of the glass substrate for mask blanks for use in various kinds of lithography are becoming severer year by year. In particular, with the wavelength of the light from the exposing source being shorter, the requirements for the profile accuracy (surface roughness) of the main surface and for the absence of the defects (particles, scratches, pits, etc.) in the surface are becoming severer, and a glass substrate having an extremely small surface roughness and having few microdefects is desired For example, in a case of a glass substrate for mask blanks for use in lithography using an ArF excimer laser as the light from an exposing source, the root-mean-square surface roughness (RMS) of the main surface may be required to be 0.15 nm or less and the number of the defects therein having a polyethylene latex particle diameter-equivalent size of 50 nm or more may be required to be 5 or less.

Accordingly, the main surface of a glass substrate for mask blanks is chemomechanically polished so as to have a desired surface roughness, by using a particulate polishing agent such as colloidal silica, cerium oxide, zirconia or alumina.

In the case where a subject to be polished, such as the main surface of a glass substrate for mask blanks or the like, is polished, using a polishing agent, the particulate polishing agent would adhere to the surface of the polished subject to remain on the polished subject. Consequently, for the purpose of removing the polishing agent remaining on the polished subject, in general, the polished subject is washed in wet.

SUMMARY OF THE INVENTION

Even after washing in wet, a polishing agent may still remain on the main surface of a glass substrate for mask blanks which is a subject to be polished. The polishing agent remaining on the main surface of a glass substrate for mask blanks after washing in wet would strongly bond to the surface by van der Waals force, and is difficult to be removed.

For solving the above-mentioned problems in the related art, an object of an aspect of the present invention is to provide a glass substrate for mask blanks from which the foreign substances existing on the main surface are easy to be removed.

The present inventors have assiduously studied these problems and, as a result, have found that even though the surface roughness of the main surface is on the same degree, the difficulty in removing foreign substances existing on the main surface differs depending on the distribution profile of surface irregularities which would lead to the surface roughness.

An aspect of the present invention provides a glass substrate for a mask blank, wherein a root-mean-square surface roughness (RMS) in at least one main surface is 0.15 nm or less, and an aspect ratio of a surface profile (Str) of the main surface in accordance with ISO 25178-2:2012, which is determined through measurement of the surface profile at measurement intervals of 0.2 nm or less in a measurement range of 100 nm×100 nm using an atomic force microscope, where s=0.2, is 0.30 or more.

In addition, an aspect of the present invention provides a substrate with a reflection layer for EUV lithography (EUVL), including: the glass substrate for a mask blank; and as a reflection layer, a multilayer reflection film formed on the main surface of the glass substrate for a mask blank, wherein the multilayer reflection film is formed by alternately laminating a low-refractivity layer and a high-refractivity layer in plural times, and the main surface of the glass substrate has the RMS of 0.15 nm or less and the Str of 0.30 or more.

In addition, an aspect of the present invention provides a substrate with a reflection layer for EUV lithography (EUVL), including: a glass substrate; and as a reflection layer, a multilayer reflection film formed on the glass substrate, wherein the multilayer reflection film is formed by alternately laminating a low-refractivity layer and a high-refractivity layer in plural times, and a root-mean-square surface roughness (RMS) in one surface of the multilayer reflection film is 0.15 nm or less, and an aspect ratio of a surface profile (Str) of the surface of the multilayer reflection film in accordance with ISO 25178-2:2012, which is determined through measurement of the surface profile at measurement intervals of 0.2 nm or less in a measurement range of 100 nm×100 nm using an atomic force microscope, where s=0.2, is 0.30 or more.

In addition, an aspect of the present invention provides a reflection mask blank for EUVL, including the multilayer reflection film of the substrate with a reflection layer for EUVL and an adsorption layer formed on the multilayer reflection film.

In addition, an aspect of the present invention provides a reflection mask blank for EUV lithography, including a multilayer reflection film and an absorption film in this order on the main surface of the glass substrate for a mask blank, the main surface having the RMS of 0.15 nm or less and the Str of 0.30 or more.

In the glass substrate for a mask blank of an aspect of the present invention, foreign substances existing in the main surface are easy to be removed. Therefore, foreign substances having adhered to the surface of the substrate during polishing or the like can be readily removed by wet-washing or the like, and the number of the defects whose polystyrene latex particle diameter-equivalent size is 50 nm or more can be controlled to 5 or less.

BRIEF DESCRIPTION OF THE DRAWINGS

FIG. 1A shows a case where the uniformity of the surface profile of projections is high, and FIG. 1B shows a case where the uniformity of the surface profile of projections is low.

DETAILED DESCRIPTION OF THE INVENTION

Hereinunder with reference to the drawings, the glass substrate for mask blanks of an aspect of the present invention is described.

As described above, the present inventors have found that, even though the surface roughness of a main surface is on the same level, the difficulty in removing foreign substances existing on the main surface differs depending on the distribution profile of surface irregularities which would lead to the surface roughness.

Figure 1A:
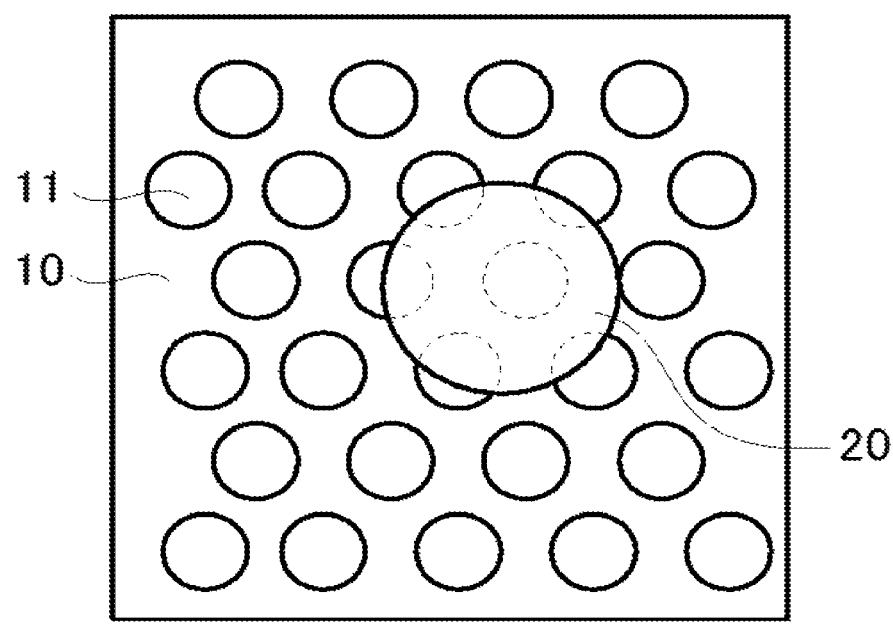
FIG. 1A and FIG. 1B are schematic views each showing a main surface of a glass substrate having projections.
Figure 1B:
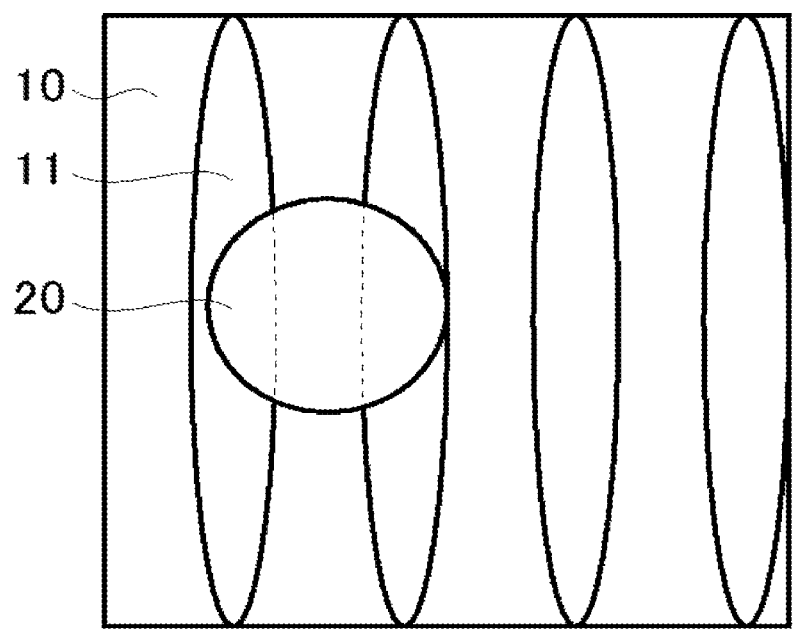

FIG. 1A and FIG. 1B are schematic views each showing a main surface of a glass substrate having projections. The glass substrate 10 shown in FIG. 1A and FIG. 1B differs in the distribution profile of the projections 11 in the main surface thereof. In the glass substrate 10 shown in FIG. 1A, the projections 11 uniformly distribute in the main surface with no directionality. Therefore, the uniformity of the surface profile originating in the projections 11 is high. On the other hand, in the glass substrate 10 in FIG. 1B, the projections 11 exist in the main surface as aligned in the lateral direction in the drawing, and the distribution thereof is non-uniform. Therefore, the uniformity of the surface profile originating in the projections 11 is low.

In the glass substrate 10 shown in FIG. 1A where the uniformity of the surface profile originating in the projections 11 is high, in a case where a foreign substance 20 exists on the main surface, the contact between the projections 11 in the main surface 10 and the foreign substance 20 is point contacts, and the contact area between the two is small. The foreign substance 20 such as a particulate polishing agent adheres to the main surface of the glass substrate 10 by van der Waals force, and the van der Waals force is proportional to the contact area, and therefore in the case of the glass substrate 10 shown in FIG. 1A, the adhesion force of the foreign substance 20 to the main surface of the glass substrate 10 is weak, and the foreign substance can be readily removed from the main surface 10 by wet-washing or the like.

On the other hand, in the glass substrate 10 shown in FIG. 1B where the surface roughness originating in the projections 11 is anisotropic, in a case where the foreign substance 20 exists on the main surface, the contact between the projections 11 in the main surface 10 and the foreign substance 20 is line contacts, and the contact area between the two is large. Therefore, the adhesion force of the foreign substance 20 to the main surface of the glass substrate 10 is strong, and the foreign substance is difficult to be removed from the main surface 10.

In the above, a case where projections exist in the main surface of a glass substrate is described, and a relationship between the uniformity of the surface profile originating in the projections and the easiness in removing a foreign substance existing on the main surface of the glass substrate in this case is shown. The same shall apply also to a case where recesses exist in the main surface of a glass substrate, in point of the relationship between the uniformity of the surface profile originating in the recesses and the easiness in removing a foreign substance existing on the main surface of the glass substrate. Specifically, in a case where the uniformity of the surface profile originating in the recesses is high, the foreign substance existing on the main surface of the glass substrate is easy to be removed, but in a case where the uniformity of the surface profile originating in the recesses is low, the foreign substance existing on the main surface of the glass substrate is difficult to be removed.

Consequently, by increasing the uniformity of the surface profile originating in surface irregularities, it may be easy to remove foreign substances existing on the main surface of a glass substrate.

In an aspect of the present invention, as an index of the uniformity of surface profile originating in surface irregularities, an aspect ratio of surface profile (Str) in accordance with ISO 25178-2:2012 is used. The aspect ratio of surface profile (Str) is a parameter of indicating the uniformity of surface profile, and is calculated by dividing the horizontal distance in the direction in which the autocorrelation function in accordance with ISO 25178-2:2012 attenuates to a specific value s fastest (minimum autocorrelation length Sa1) by the horizontal distance in the direction in which the autocorrelation function attenuates to s latest. The default value of the specific value s is 0.2, and also in an aspect of the present invention, "s=0.2" is used.

In the glass substrate for mask blanks of an aspect of the present invention, the aspect ratio of the surface profile (Str) of at least one main surface, which is determined through measurement of the surface profile at measurement intervals of 0.2 nm or less in a measurement range of 100 nm×100 nm using an atomic force microscope, where s=0.2, is 0.30 or more.

Here, the at least one surface is referred to, and this is because, in the case of a glass substrate for mask blanks, the surface profile of the main surface thereof is required to be excellent, that is, it is required that the surface roughness is low and there exist few defects in the surface, and the main surface is to be on the exposure side in lithography. However, it is desirable that the surface profile of the back side relative to the exposure side is also excellent.

The reason why the measurement range is 100 nm×100 nm and the measurement interval is 0.2 nm or less is as follows.

<Reason Why the Measurement Range is 100 nm×100 nm and the Measurement Interval is 0.2 nm or Less>

The surface roughness of a substrate for mask blanks is determined by the particle size of the polishing agent to be used during chemomechanical polishing. This is because the periodical streaky surface roughness corresponding to the particle size of the polishing agent used is transferred onto the substrate surface. For obtaining a substrate surface having RMS of 0.15 nm or less, it is general to conduct chemomechanical polishing using a colloidal silica having a mean particle size of from 5 to 50 nm as an polishing agent. In the case, there exists a surface roughness having a space wavelength of from 5 to 50 nm on the substrate surface. The surface roughness having a space wavelength of from 5 to 50 nm has a greatest influence on adhesion of foreign substances having a polystyrene latex particle-equivalent size of 50 nm or more to the surface. From these reasons, as the condition most suitable for detecting the surface roughness having a space wavelength of from 5 to 50 nm, the measurement range is 100 nm×100 nm and the measurement interval is 0.2 nm or less.

When the aspect ratio of the surface profile (Str) defined in the above is 0.30 or more, the uniformity of the surface profile originating in surface irregularities is sufficiently high, and therefore the foreign substances existing on the main surface of a glass substrate can be readily removed by wet-washing or the like and the number of the defects having a polystyrene latex particle-equivalent size of 50 nm or more can be 5 or less.

The aspect ratio of the surface profile (Str) as defined above is preferably 0.35 or more.

The upper limit of the aspect ratio of the surface profile (Str) as defined above is theoretically 1.0, but the upper limit of the aspect ratio of the surface profile (Str), as measured by actually analyzing the main surface of a glass substrate for mask blanks with an atomic force microscope, is about 0.7.

In the glass substrate for mask blanks of an aspect of the present invention, the aspect ratio of the surface profile (Str) of the main surface is required to be 0.30 or more, and in addition thereto, the surface roughness thereof is required to be small. Concretely, the root-mean-square surface roughness (RMS) of the main surface is 0.15 nm or less, preferably 0.12 nm or less, more preferably 0.10 nm or less.

In this specification, the surface roughness is the root-mean-square roughness Rq (formerly RMS) in accordance with JIS-B0601:2013.

The glass substrate for mask blanks of an aspect of the present invention especially for use in lithography using an EUV light is further described hereinunder.

Preferably, the glass constituting the glass substrate for mask blanks of an aspect of the present invention has a small coefficient of thermal expansion and the fluctuation of the coefficient of thermal expansion thereof is small. Concretely, a low-thermal expansion glass having an absolute value of a coefficient of thermal expansion at 20° C. of 600 ppb/° C. is preferred, an ultra-low-thermal expansion glass having a coefficient of thermal expansion at 20° C. of 400 ppb/° C. is more preferred, an ultra-low-thermal expansion glass having a coefficient of thermal expansion at 20° C. of 100 ppb/° C. is even more preferred, and one having 30 ppb/° C. is still more preferred.

As the above-mentioned low-thermal expansion glass and ultra-low-thermal expansion glass, glass mainly containing $SiO_2$, typically synthetic quartz glass is usable. Concretely, examples thereof include synthetic quartz glass, AQ series (synthetic quartz glass manufactured by Asahi Glass Company, Ltd.), synthetic quartz glass mainly containing $SiO_2$ and containing from 1 to 12% by mass of $TiO_2$, and AZ (Zero-expansion glass manufactured by Asahi Glass Company, Ltd.).

The size and the thickness of the glass substrate for mask blanks may be suitably determined depending on the planned values of masks, etc. In Examples to be given hereinunder, a synthetic quartz glass sheet having an outer size of 6 inches (152 mm) square and a thickness of 0.25 inches (6.35 mm) was used.

As described above, when producing a glass substrate for mask blanks, a particulate polishing agent such as colloidal silica, cerium oxide, zirconia or alumina is used for chemomechanically polishing it in order that the main surface thereof could have a desired surface roughness.

Here, in order that the aspect ratio of the surface profile (Str) defined above could be 0.30 or more, it is effective to control the following chemomechanical polishing conditions.

(1) As the particle size of the polishing agent is smaller, the uniformity of the surface profile of the chemomechanically-polished surface is more increased. Therefore, in order that the aspect ratio of the surface profile (Str) defined above could be 0.30 or more, it is desirable that the particle size of the polishing agent to be used is smaller. Concretely, it is desirable that the mean particle size of the polishing agent is 20 nm or less, more preferably 15 nm or less.

(2) As to the polishing pad to be used in chemomechanical polishing, the pad surface is subjected to conditioning treatment for setting. For the conditioning treatment, a conditioning plate with diamond particles adhered to the surface thereof is used. As the particle size of the diamond particles adhered to the surface of a conditioning plate to be used in the conditioning treatment is smaller, the surface profile of the polishing pad is more improved, and the uniformity of the main surface of the chemomechanically-polished glass substrate for mask blanks also is more improved. Consequently, in order that the aspect ratio of the surface profile (Str) defined above could be 0.30 or more, it is desirable to use a finer conditioning plate (with diamond particles having a small particle size adhering thereto) for the conditioning treatment to the polishing pad. Concretely, it is desirable to use a conditioning plate to which diamond particles having a mean particle size of 30 μm or less are adhered.

A predetermined optical film is formed on the main surface of the glass substrate for mask blanks of an aspect of the present invention whose RMS is 0.15 nm or less and Str is 0.30 or more, thereby giving a mask blank for lithography. In a case of a mask blank for EUVL, a reflection layer capable of reflecting an EUV light is formed on the main surface of the glass substrate for mask blanks whose RMS is 0.15 nm or less and Str is 0.30 or more, and an absorption layer capable of absorbing an EUV light is formed on the reflection layer. Here, as the reflection layer, a multilayer reflection film formed by alternately laminating a low-refractivity layer to be a layer having a low refractive index relative to EUV light and a high-refractivity layer to be a layer having a high refractivity relative to EUV light in plural times is widely used. Also in an aspect of the present invention, a multilayer reflection film is formed on the main surface of the glass substrate for mask blanks, as the reflection layer. In an aspect of the present invention where a multilayer reflection film is formed on the main surface of the glass substrate for mask blanks, the state before formation of an absorption layer of the reflective mask blank for EUVL, that is, one having a multilayer reflection film formed on the main surface of the glass substrate for mask blanks is the substrate with a reflection layer for EUVL of an aspect of the present invention. The surface profile of the main surface of the glass substrate for mask blanks described above is reflected on the surface profile of the multilayer reflection film formed on the main surface of the glass substrate for mask blanks. Accordingly, the surface roughness of the multilayer reflection film formed on the main surface of the glass substrate for mask blanks is small and the uniformity of the surface profile thereof is high. Concretely, the root-mean-square surface roughness (RMS) of the surface of the multilayer reflection film may be 0.15 nm or less.

EXAMPLES

In Examples, the chemomechanically-polished main surface of a glass substrate for mask blanks (a synthetic quartz glass substrate having an outer size of 6 inches (152 mm) square and a thickness of 0.25 inches (6.35 mm)) was precision-washed by physical force and chemical force, and then using an atomic force microscope, the surface profile of one main surface thereof was analyzed at measurement intervals of 0.2 nm or less in a range of 100 nm×100 nm (100 nm square), thereby determining the aspect ratio (Str) in accordance with ISO 25178-2:2012 at s=0.2. In addition, the root-mean-square surface roughness (RMS) of the main surface was determined.

The results are as follows.

Example 1

Str 0.20 RMS 0.10 nm

Example 2

Str 0.28 RMS 0.09 nm

Example 3

Str 0.37 RMS 0.09 nm

In Examples 1 to 3, the chemomechanically-polished main surface of the glass substrate for mask blanks was precision-washed by physical force and chemical force, and then using a defect detector M7360, manufactured by Lasertec Corporation, the number of the defects having a polystyrene latex particle diameter-equivalent size of 50 nm or more in the surface was counted. The results are shown in FIG. 2.

Figure 2:
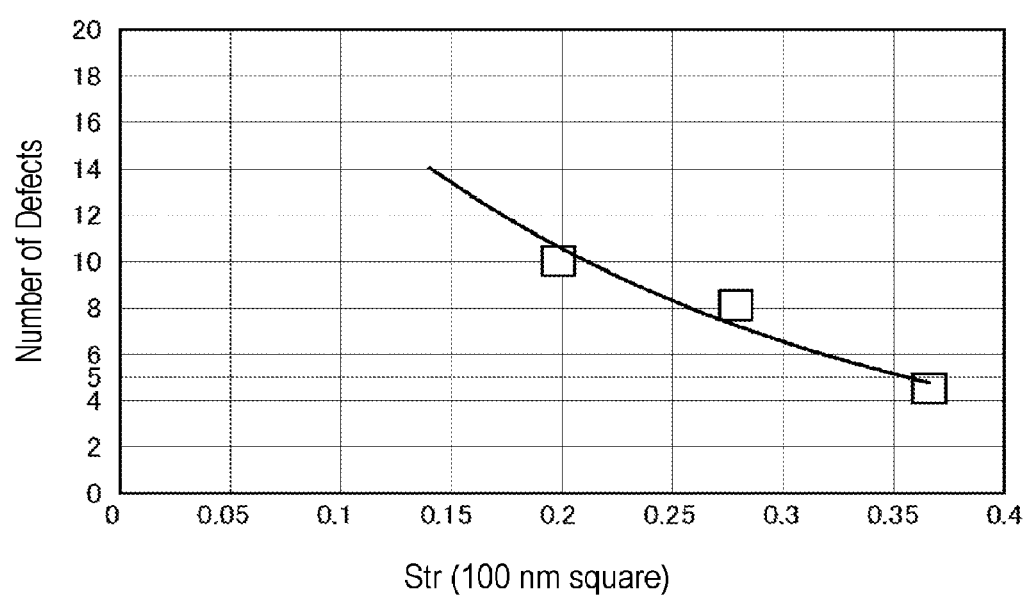
FIG. 2 is a graph showing a relationship between the aspect ratio Str (100 mm square) of the surface profile and the number of the defects whose polystyrene latex particle diameter-equivalent size is 50 nm or more, in Examples.

As obvious from FIG. 2, in Examples 1 and 2 where the aspect ratio (Str) is smaller than 0.30, the number of the defects having polystyrene latex particle diameter-equivalent size of 50 nm or more does not satisfy the requirement value, i.e. 5 or less, while in Example 3 where the aspect ratio (Str) is larger than 0.30, the number satisfies the requirement value.

In addition, when a most ordinary Mo/Si multilayer reflection film ((Mo layer (2.3 nm)+Si layer (4.5 nm))× 50=340 nm) was formed on the main surface of a glass substrate for mask blanks where Str as measured according to the above-mentioned process was 0.25, as a multilayer reflection film for mask blanks for EUVL, and then Str of surface of the most ordinary Mo/Si multilayer reflection film was measured according to the above-mentioned process, and Str thereof was 0.28, and it was confirmed that Str changed little before and after the formation of the Mo/Si multilayer reflection film.

REFERENCE SIGNS LIST

10: Glass Substrate
11: Projection
20: Foreign Substance

What is claimed is:

1. A glass substrate for a mask blank, having two main surfaces, wherein a root-mean-square surface roughness in at least one main surface among the two main surfaces is 0.15 nm or less, and an aspect ratio of a surface profile of the at least one main surface is 0.30 or more, wherein the aspect ratio is a value obtained by dividing a horizontal distance in a direction in which an autocorrelation function defined in ISO 25178-2:2012 has a fastest decay to 0.2 by a horizontal distance in a direction in which the autocorrelation function has the latest decay to 0.2, and the aspect ratio is determined through measurement of the surface profile at measurement intervals of 0.2 nm or less in a measurement area of 100 nm×100 nm using an atomic force microscope.

2. A reflection mask blank for extreme ultraviolet lithography, comprising:
the glass substrate as described in claim 1; and
a multilayer reflection film and an absorption film in this order on the at least one main surface of the glass substrate.

3. The reflection mask blank according to claim 2, wherein the aspect ratio of the surface profile of the at least one main surface is 0.35 or more.

4. The reflection mask blank according to claim 2, wherein the root-mean-square surface roughness in the at least one main surface is 0.10 nm or less.

5. The reflection mask blank according to claim 2, wherein the glass substrate is made of glass having a coefficient of thermal expansion at 20° C. of 30 ppb/° C. or less.

6. The reflection mask blank according to claim 5, wherein the glass is synthetic quartz glass comprising $SiO_2$ and from 1 to 12% by mass of $TiO_2$.

7. The glass substrate according to claim 1, wherein the aspect ratio of the surface profile of the at least one main surface is 0.35 or more.

8. The glass substrate according to claim 1, wherein the root-mean-square surface roughness in the at least one main surface is 0.10 nm or less.

9. The glass substrate according to claim 1, wherein the glass substrate is made of glass having a coefficient of thermal expansion at 20° C. of 30 ppb/° C. or less.

10. The glass substrate according to claim 9, wherein the glass is synthetic quartz glass comprising $SiO_2$ and from 1 to 12% by mass of $TiO_2$.

11. A substrate with a reflection layer for extreme ultraviolet lithography, comprising:
the glass substrate for a mask blank as described in claim 1; and
a reflection layer comprising a multilayer reflection film formed on the at least one main surface of the glass substrate for a mask blank,
wherein the multilayer reflection film is formed by alternately laminating layers having a low refractive index and layers having a high refractive index.

12. A reflection mask blank for extreme ultraviolet lithography, comprising the substrate with a reflection layer as described in claim 11 and an absorption layer formed on the multilayer reflection film.

13. A substrate with a reflection layer for extreme ultraviolet lithography, comprising:
a glass substrate; and
a reflection layer comprising a multilayer reflection film formed on a main surface of the glass substrate,
wherein the multilayer reflection film is formed by alternately laminating layers having a low refractive index and layers having a high refractive index, and a root-mean-square surface roughness in a surface of the multilayer reflection film is 0.15 nm or less, and an aspect ratio of a surface profile of the surface of the multilayer reflection film is 0.30 or more, wherein the aspect ratio is a value obtained by dividing a horizontal distance in a direction in which an autocorrelation function defined in ISO 25178-2:2012 has a fastest decay to 0.2 by a horizontal distance in a direction in which the autocorrelation function has the latest decay to 0.2, and the aspect ratio is determined through measurement of the surface profile at measurement intervals of 0.2 nm or less in a measurement area of 100 nm×100 nm using an atomic force microscope.

14. A reflection mask blank for extreme ultraviolet lithography, comprising the substrate with a reflection layer as described in claim 13 and an absorption layer formed on the multilayer reflection film.

* * * * *